(12) United States Patent
Dia et al.

(10) Patent No.: US 12,081,214 B2
(45) Date of Patent: Sep. 3, 2024

(54) CLOCK GATING CELLS

(71) Applicant: MEDIATEK INC., Hsinchu (TW)

(72) Inventors: Kin-Hooi Dia, Hsinchu (TW); Ssu-Yen Wu, Hsinchu (TW); Shih-Yun Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/054,032

(22) Filed: Nov. 9, 2022

(65) Prior Publication Data

US 2023/0179206 A1 Jun. 8, 2023

Related U.S. Application Data

(60) Provisional application No. 63/286,585, filed on Dec. 7, 2021.

(51) Int. Cl.
*H03K 19/00* (2006.01)
(52) U.S. Cl.
CPC .................. *H03K 19/0016* (2013.01)
(58) Field of Classification Search
CPC ............... H03K 19/0016; H03K 3/356; H03K 3/356121; H03K 3/012
See application file for complete search history.

(56) References Cited

U.S. PATENT DOCUMENTS

| | | | |
|---|---|---|---|
| 10,761,559 B2 | 9/2020 | Zerwick | |
| 11,244,046 B2 | 2/2022 | Hershman | |
| 11,422,819 B2 | 8/2022 | Huang et al. | |
| 2008/0129359 A1 | 6/2008 | Lee | |
| 2009/0267649 A1 | 10/2009 | Saint-Laurent et al. | |
| 2012/0286824 A1* | 11/2012 | Myers | H03K 19/0016 716/119 |
| 2016/0077544 A1* | 3/2016 | Tzeng | G06F 1/10 327/291 |
| 2018/0348809 A1* | 12/2018 | Saint-Laurent | G06F 1/3237 |
| 2021/0313986 A1* | 10/2021 | Lo | G01R 31/318552 |

FOREIGN PATENT DOCUMENTS

| | | |
|---|---|---|
| CN | 113268941 A | 8/2021 |
| TW | 202113655 A | 4/2021 |
| WO | 2016/114892 A1 | 7/2016 |

OTHER PUBLICATIONS

Extended European Search Report dated May 11, 2023, issued in application No. EP 22210445.7.
Chinese language office action dated Jul. 12, 2023, issued in application No. TW 111146945.

* cited by examiner

*Primary Examiner* — Sibin Chen
(74) *Attorney, Agent, or Firm* — McClure, Qualey & Rodack, LLP

(57) ABSTRACT

A clock gating cell is provided. The clock gating cell includes an input stage and an output stage. The input stage receives a first clock signal and at least one input enable signal and generates a first enable signal corresponding to one of the least one input enable signal according to the first clock signal. The output stage is coupled to the input stage. The output stage receives the first enable signal and the first clock signal and generates a clock gating signal according to the first enable signal and the first clock signal. The input stage operates based on a first voltage threshold, and the output stage operates based on a second voltage threshold. The first voltage threshold is different from the second voltage threshold.

16 Claims, 10 Drawing Sheets

CLOCK GATING CELLS

CROSS REFERENCE TO RELATED APPLICATIONS

This application claims the benefit of U.S. Provisional Application No. 63/286,585, filed Dec. 7, 2021, the entirety of which is/are incorporated by reference herein.

BACKGROUND OF THE INVENTION

Field of the Invention

The invention relates to a clock gating cell, and more particularly to a low power clock gating cell.

Description of the Related Art

A clock tree is a clock distribution network within a system or hardware design. A clock tree comprises a clock source, clock cells (such as buffers or inverters), and clock gating cells. These components are connected to form clock branches to provide various clock signals. Generally, within a clock tree, each clock gating cell operates based on a single voltage threshold. In other words, all the devices in one clock gating cell operate based on the same voltage threshold. For example, each clock gating cell within a clock tree operates based on a low voltage threshold so that the clock tree performs better. However, a clock gate cell with a low voltage threshold may induce a larger leakage current, which causes high power consumption.

BRIEF SUMMARY OF THE INVENTION

Thus, the present invention provides a low power clock gating cell which operate based on multiple voltage thresholds, which reduces the leakage current.

An exemplary embodiment of a clock gating cell. The clock gating cell comprises an input stage and an output stage. The input stage receives a first clock signal and at least one input enable signal and generates a first enable signal corresponding to one of the least one input enable signal according to the first clock signal. The output stage is coupled to the input stage. The output stage receives the first enable signal and the first clock signal and generates a clock gating signal according to the first enable signal and the first clock signal. The input stage operates based on a first voltage threshold, and the output stage operates based on a second voltage threshold. The first voltage threshold is different from the second voltage threshold.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
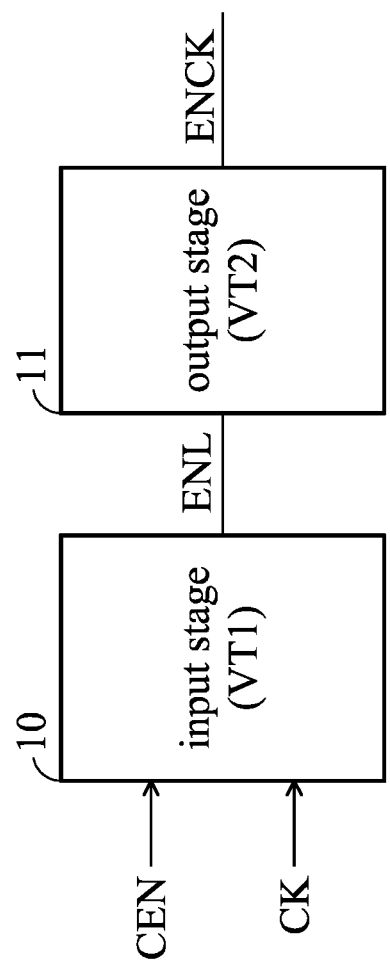
FIG. 1 shows one exemplary embodiment of a clock gating cell.

FIG. 1 shows an exemplary embodiment of a clock gating cell. As shown in FIG. 1, a clock gating cell 1 comprises an input stage 10 and an output stage 11. In an embodiment, a clock tree comprises a plurality of clock gating cell 1. For example, at least one clock gating cell is used in each branch of the clock tree. The input stage 10 operates based on a voltage threshold VT1, while the output stage 11 operates based on a voltage threshold VT2. The voltage threshold VT1 is different from the voltage threshold VT2. In one embodiment, the voltage threshold VT1 is greater than the voltage threshold VT2. In another embodiment, the voltage threshold VT2 is greater than the voltage threshold VT1. The magnitude relationship between the voltage thresholds VT1 and VT2 is determined according to the requirements or specifications of system or hardware designs.

Referring to FIG. 1, the clock gating cell 1 receives an input enable signal and a clock signal CK and generates a clock gating signal ENCK. The input enable signal may be a clock enable signal CEN or a testing enable signal TEN. In an embodiment, the testing enable signal TEN may be a signal for enabling a testing mode, for example, a scan testing mode for detecting faults occurring in a combinational logic circuit associated with the clock gating cell. The clock enable signal CEN may be a signal for enabling the transmission of the clock signal CK, for example, in a normal operation.

In the embodiment of FIG. 1, the clock gating cell 1 receiving the clock enable signal CEN as the input enable signal is taken as an example for explaining the operation of the clock gating cell 1. The input stage 10 receives the clock signal CK and the clock enable signal CEN. The input stage 10 latches the clock enable signal CEN according to the clock signal CK to generate an enable signal ENL. For example, in response to each falling edge of the clock signal CK, the voltage level of the clock enable CEN is sampled, and the input stage 10 generates the enable signal ENL with the sample voltage level. The output stage 11 is coupled to the input stage 10 to receive the enable signal ENL. The output stage 11 further receives the clock signal CK. The output stage 11 generates a clock gating signal ENCK according to the enable signal ENL and the clock signal CK. The clock gating signal ENCK corresponds to the clock signal CK in an asserted period of the ENL enable signal. Thus, the clock gating operation is achieved.

Figure 2A:
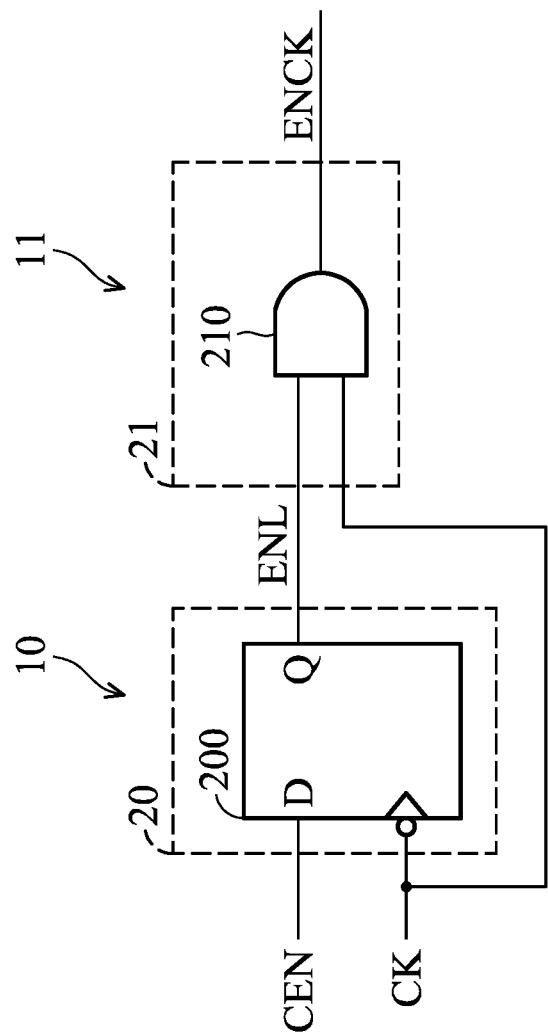
FIG. 2A shows another exemplary embodiment of a clock gating cell.

FIG. 2A shows another exemplary embodiment of a clock gating cell. Referring to FIG. 2A, the input stage 10 comprises a latch circuit 20, and the output stage 11 comprises an AND gate circuit 21. The latch circuit 20 receives the clock enable signal CEN and the clock signal CK and latches the clock enable signal CEN in response to the rising or falling edges of the clock signal CK to generate the enable signal ENL. In the embodiment of FIG. 2A, the latch circuit 20 is implemented by a D latch 200. The D latch 200 has a data input terminal (D) receiving the clock enable signal CEN, a clock input terminal receiving the clock signal CK, and an output terminal (Q) outputting the enable signal ENL. The D latch 200 is triggered by the falling edges of the clock signal CK. In response to each falling edge of the clock signal CK, the enable signal ENL generated at the output terminal (Q) has the same voltage level as the clock enable signal CEN, thereby latching the clock enable signal CEN in response to the falling edges of the clock signal CK.

Figure 3:
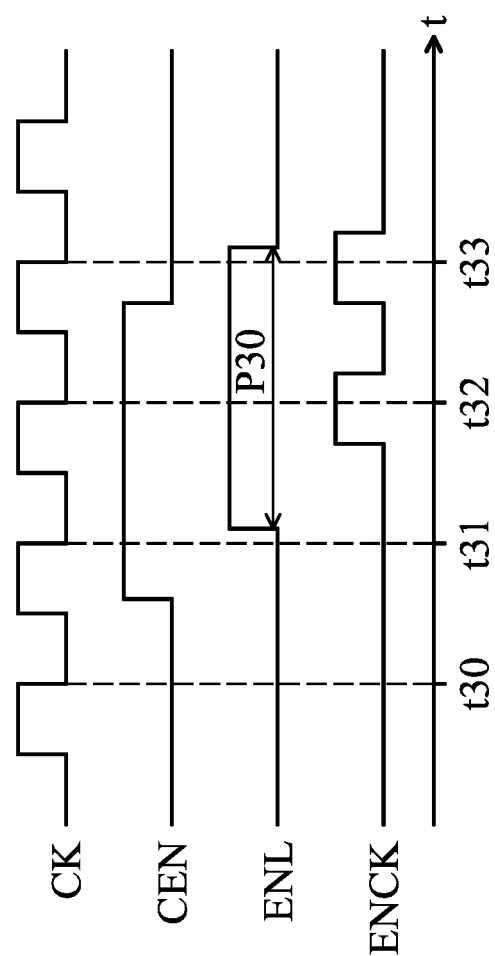
FIG. 3 shows a timing chart of signals of a clock gating cell according to one exemplary embodiment.

FIG. 3 shows a timing chart of the signals of clock gating cell 1. Referring to FIGS. 2A and 3, in response to the falling edge of the clock signal CK at the time point t30, the enable signal ENL is at a low voltage level because the clock enable signal CEN is at a low voltage level at the time point t30. After the time point t30, the clock enable signal CEN is switched to a high voltage level (that is, the clock enable signal CEN is asserted). In response to the falling edge of the clock signal CK at the time point t31, the enable signal ENL is switched to a high voltage level (that is, the enable signal ENL is asserted) due to the high voltage level of the clock enable signal CEN. In response to the falling edge of the clock signal CK at the time point t32, the enable signal ENL is maintained at the high voltage level because the clock enable signal CEN is still at the high voltage level at the time point t32. After the time point t32, the clock enable signal CK is switched to the low voltage level. Then, in response to the falling edge of the clock signal CK at the time point t33, the enable signal ENL is switched to the low voltage level due to the low voltage level of the clock enable signal CEN. Through the operation of the D latch 200, the clock enable signal CEN is latched in response to the falling edges of the clock signal CK to generate the enable signal ENL that is asserted (high voltage level) during the period P30.

Referring to FIG. 2A, the output stage 11 comprises an AND gate circuit 21. The AND gate circuit 21 receives the enable signal ENL and the clock signal CK and generates the clock gating signal ENCK which corresponds to the clock signal CK in the asserted period P30 of the enable signal ENL. In the embodiment of FIG. 2A, the AND gate circuit 21 is implemented by an AND logic gate 210. One input terminal of the AND logic gate 210 receives the enable signal ENL, the other input terminal thereof receives the clock signal CK, and an output terminal generating the clock gating signal ENCK. Based on the operation of the AND logic gate 210, the clock gating signal ENCK varies with the clock signal CK during the asserted period P30 of the enable signal ENL, as shown in FIG. 3A. The clock gating signal ENCK corresponds to the clock signal CK during the asserted period P30 of the enable signal ENL. Referring to FIG. 3, there are two pulses on the clock gating signal ENCK during the asserted period P30. Except these two pulse, the clock gating signal ENCK is maintained at the low voltage level, thereby achieving the clock gating operation of the clock gating cell.

In the embodiment of FIG. 2A, the latch circuit 20 in the input stage 10 operates based on the voltage threshold VT1, while the AND gate circuit 21 in the output stage 11 operates based on the voltage threshold VT2. In details, the D latch 200 operates based on the voltage threshold VT1, while the AND logic gate 210 operates based on the voltage threshold VT2.

Figure 2B:
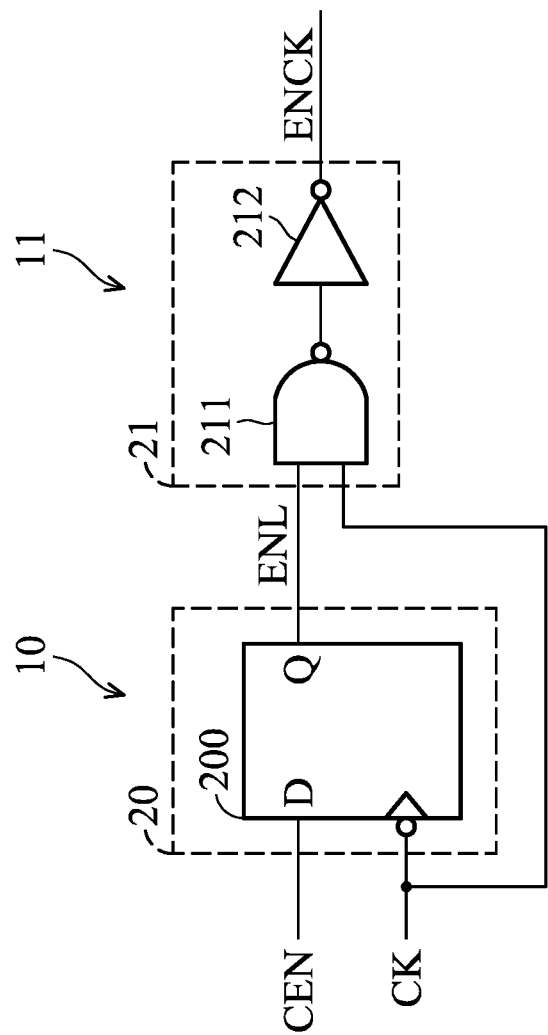
FIG. 2B shows another exemplary embodiment of a clock gating cell.

In another embodiment, the AND gate circuit 21 is implemented by a NAND logic gate 211 and an inverter 212, as shown in FIG. 2B. One input terminal of the NAND logic gate 211 receives the clock signal CK, and the other input terminal thereof receives the enable ENL. The input terminal of the inverter 212 is coupled to the output terminal of the NAND logic gate 211, and an output terminal thereof outputs the clock gating signal ENCK. Based on the logic operations of the NAND logic gate 211 and the inverter 212, the above operation of the AND gate circuit 21 implemented by the AND logic gate 210 can be achieved through the NAND logic gate 211 and the inverter 212. In the embodiment of FIG. 2B, the NAND logic gate 211 and the inverter 212 operate based on the voltage threshold VT2.

Figure 4A:
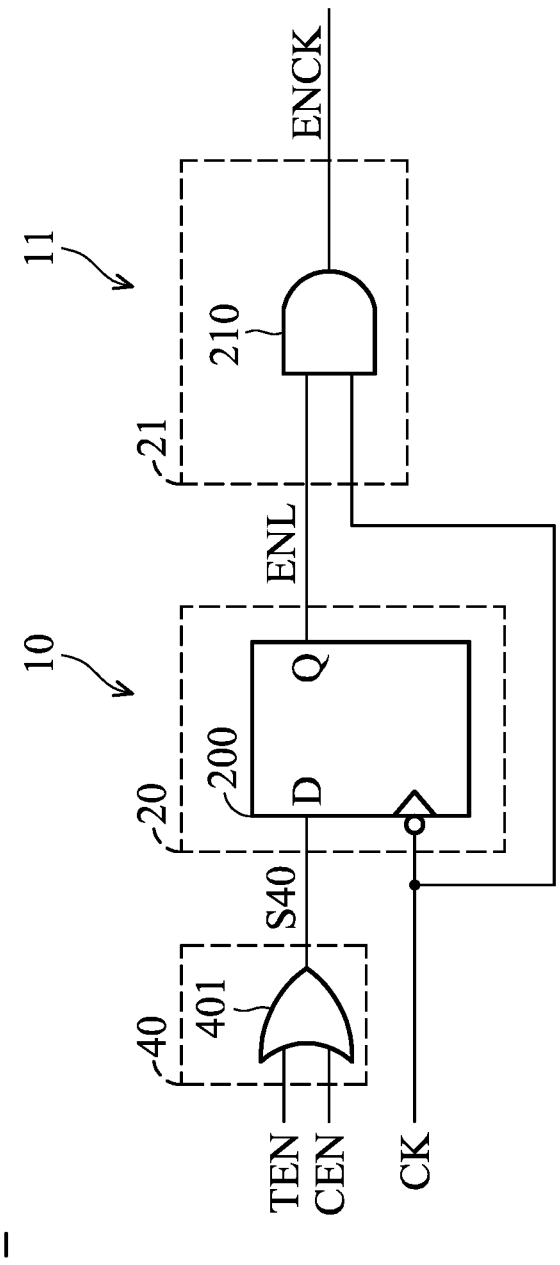
FIG. 4A shows another exemplary embodiment of a clock gating cell.

According to another embodiment, the clock gating cell 1 may receive two different input enable signals. For example, the clock gating cell 1 receives both of the clock enable signal CEN and the testing enable signal TEN. Referring to FIG. 5, the clock enable signal CEN and the testing enable signal TEN are not asserted at the same time. For the two different input enable signals (CEN and TEN), the latch circuit 20 further comprises a selector 40 as shown in FIG. 4. The selector 40 selects one of the clock enable signal CEN and the testing enable signal TEN to serve as an enable signal S40 that is output to the data input terminal (D) of the D latch 200. In the embodiment of FIG. 4A, the selector 40 is implemented by an OR logic gate 401. One input terminal of the OR logic gate 401 receives the testing enable signal TEN, and the other input terminal thereof receives the clock enable signal CEN. The enable signal S40 is generated at the output terminal of the OR logic gate 401. Based on the logic operation of the OR logic gate 401, when one of the clock enable signal CEN and the testing enable signal TEN is asserted (high voltage level), the enable signal S40 is asserted (high voltage level) with the asserted clock enable signal CEN or testing enable signal TEN. Thus, equivalently, the asserted clock enable signal CEN or testing enable signal TEN is selected to be output to the D latch 200.

The D latch 200 and the AND logic gate 210 operate according to the enable signal S40 and the clock signal CK. The operations of the D latch 200 and the AND logic gate 210 when the clock enable signal CEN is asserted are the same as the operations described in the embodiment of FIG. 2A, and the operations thereof when the testing enable signal TEN is asserted are also the same as the operations described in the embodiment of FIG. 2A. Thus, the related description is omitted here. In the embodiment of FIG. 4A, the selector 40 operates based on the voltage threshold VT1. In details, the OR gate 401 operates based on the voltage threshold VT1.

Figure 4B:
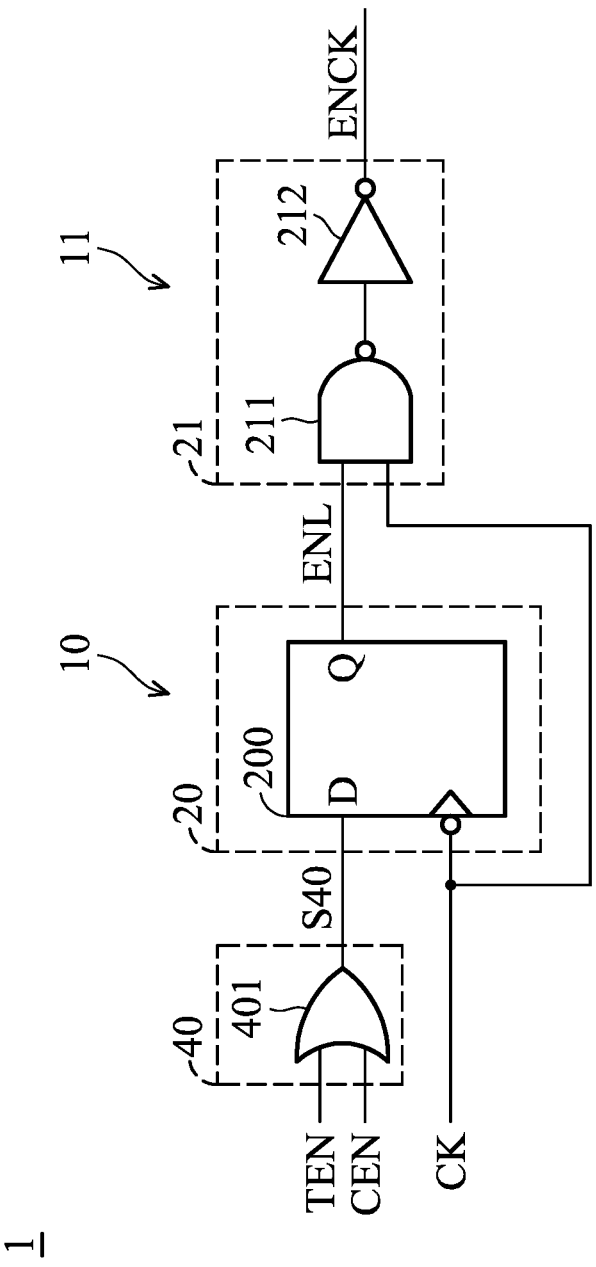
FIG. 4B shows another exemplary embodiment of a clock gating cell.
Figure 5:
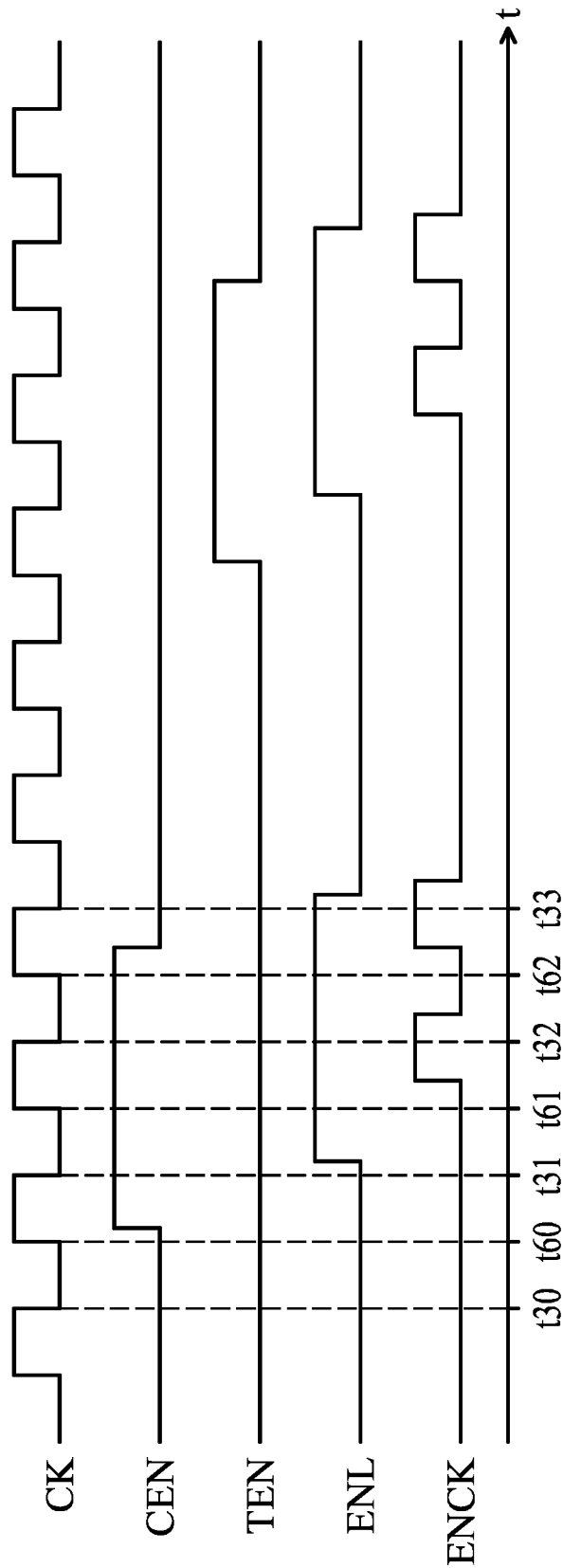
FIG. 5 shows a timing chart of signals of a clock gating cell according to another exemplary embodiment.

In another embodiment, the AND gate circuit 21 in the embodiment of FIG. 4A can be also implemented by a NAND logic gate 211 and an inverter 212, as shown in FIG. 4B. The connection and operations of the NAND logic gate 211 and the inverter 212 are the same as the embodiment of FIG. 2B. Thus, the related description is omitted here. In the embodiment of FIG. 4B, the NAND logic gate 211 and the inverter 212 operate based on the voltage threshold VT2.

Figure 6A:
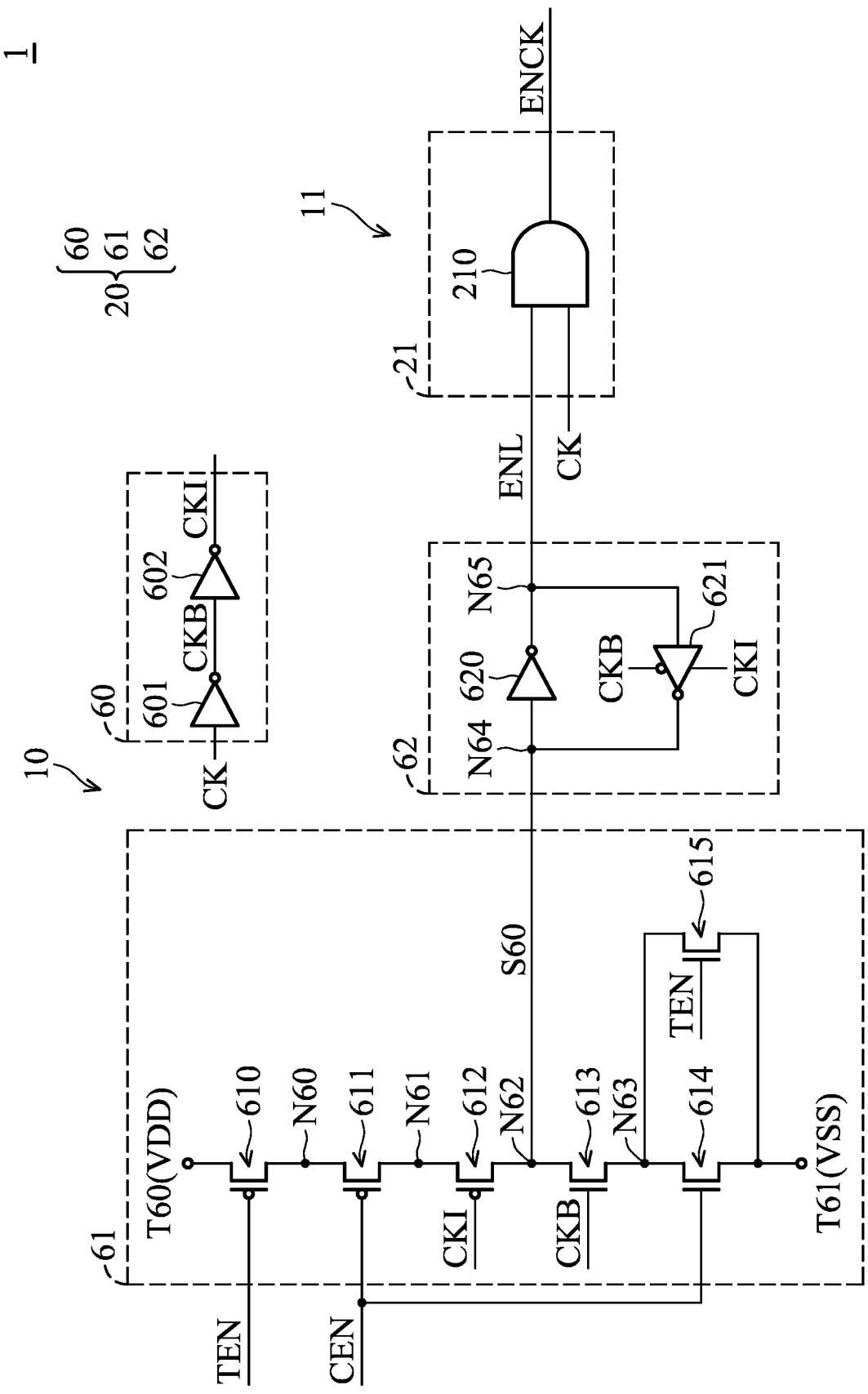
FIG. 6A shows another exemplary embodiment of a clock gating cell.

FIG. 6A shows another exemplary embodiment of the clock gating cell 1. The clock gating cell 1 receives a clock enable signal CEN, a testing enable signal TEN, and a clock signal CK. Referring to FIG. 6A, the latch circuit 20 of the input stage 10 is implemented by an inverting circuit 60, a sampling circuit 61, and a holding circuit 62. The inverting circuit 60 comprises inverters 601 and 602. The inverter 601 receives the clock signal CK and inverts the clock signal CK to generate a clock signal CKB. Then, the inverter 602 receives the clock signal CKB and inverts the clock signal CKB to generate a clock signal CKI.

As shown in FIG. 6, the sampling circuit 61 comprises P-type transistors 610-612 and N-type transistors 613-615. In the embodiment, the P-type transistors 610-612 are implemented by P-type metal-oxide-semiconductor (PMOS) transistors, and the N-type transistors 613-615 are implemented by N-type metal-oxide-semiconductor (NMOS) transistors. The source of the PMOS transistor 610 is coupled to a voltage terminal T60, the drain thereof is coupled to a node N60, and the gate thereof receives the testing enable signal TEN. The source of the PMOS transistor 611 is coupled to the node N60, the drain thereof is coupled to a node N61, and the gate thereof receives the clock enable signal CEN. The source of the PMOS transistor 612 is coupled to the node N61, the drain thereof is coupled to a node N62, and the gate thereof receives the clock signal CKI. The drain of the NMOS transistor 613 is coupled to the node N62, the source thereof is coupled to a node N63, and the gate thereof receives the clock signal CKB. The drain of the NMOS transistor 614 is coupled to the node N63, the source thereof is coupled to a voltage terminal T61, and the gate thereof receives the clock enable signal CEN. The drain of the NMOS transistor 615 is coupled to the node N63, the source thereof is coupled to a voltage terminal T61, and the gate thereof receives the testing enable signal TEN. According to the above connection of the transistors 610-615, the PMOS transistor 610 and the NMOS transistor 615 are controlled by the testing enable signal TEN, the PMOS transistor 611 and the NMOS transistor 614 are controlled by the clock enable signal CEN, the PMOS transistor 612 is controlled by the clock signal CKI, and the NMOS transistor 613 is controlled by the clock signal CKB. An enable signal S60 is generated at the node 62.

The holding circuit 62 has an input node N64 coupled to the sampling circuit 61. In details, the input node N64 of the holding circuit 62 is coupled to the node N62 to receive the enable signal S60. The output node N65 of the holding circuit 62 is coupled to the AND gate circuit 21 of the output stage 11. The holding circuit 62 comprises inverters 620 and 621. The input terminal of the inverter 620 is coupled to the input node N64 to receive the enable signal S60, and the output terminal thereof is coupled to the output node N65. The input terminal of the inverter 621 is coupled to the output node N65, and the output terminal thereof is coupled to the output node N64. The inverter 621 further receives the clock signals CKB and CKI. The inverter 621 is controlled by the clock signals CKB and CKI. In the embodiment, whether the inverter 621 is enabled is determined according to the clock signals CKB and CKI. An enable signal ENL is generated at the output node N65.

Referring to FIG. 6A, the AND logic gate 210 of the output stage 11 receives the enable signal ENL and the clock signal CK. In the embodiment of FIG. 6A, the AND logic gate 210 is implemented by an AND logic gate 210. One input terminal of the AND logic gate 210 receives the enable signal ENL, the other input terminal thereof receives the clock signal CK, and an output terminal generating the clock gating signal ENCK.

In the embodiment, the voltage terminal T60 receives an operation voltage VDD with a high level, while the voltage terminal T61 receives an operation voltage VSS with a low level.

The operation of the clock gating cell 1 in the embodiment of FIG. 6A will be described in the following paragraphs.

Referring to FIGS. 5 and 6A, when a falling edge of the clock signal CK occurs at the time point at which both of the testing enable signal TEN and the clock enable signal CEN are de-asserted (low voltage level), for example, when a falling edge of the clock signal CK occurs at the time point t30, the PMOS transistors 610-612 and the NMOS transistor 613 are turned on, and the and NMOS transistors 614 and 615 are turned off. The enable signal S60 is at a high voltage level according to the operation voltage VDD. The inverter 620 generates the enable signal ENL with a low voltage level. Due to the low voltage level of the enable signal ENL, the clock gating signal ENCK generated by the AND logic gate 210 is at a low voltage level based on the logic operation of the AND logic gate 210. In response to the falling edge of the clock signal at the time point t30, the inverter 621 is disabled by the clock signals CKB and CKI. Thus, the holding operation of the holding circuit 62 is disabled, and the holding circuit 62 provides the inverting operation on the enable signal S60.

At the time t60, there is a rising edge on the clock signal CK. Each of the PMOS transistor 612 and the NMOS transistor 613 is switched to a turned-off state. The inverter 621 is enabled by the clock signals CKB and CKI. Thus, the holding circuit 62 performs the holding operation through the inventers 620 and 621 to hold the low voltage level of the enable signal ENL.

After the time point t60, the clock enable signal CEN is switched to a high voltage level, that is, the clock enable signal CEN is asserted. The testing enable signal TEN is at the low voltage level continuously.

The next falling edge of the clock signal CK occurs at the time point t31. The PMOS transistors 610 and 612 and the NMOS transistor 613 and 614 are turned on, and the PMOS transistor 611 and NMOS transistor 615 are turned off. The enable signal S60 is switched to a low voltage level (that is, the enable signal S60 is asserted) according to the operation voltage VSS. The inverter 620 generates the enable signal ENL with a high voltage level (that is, the enable signal ENL is asserted). Due to the high voltage level of the enable signal ENL, the clock gating signal ENCK generated by the AND logic gate 210 is maintained at the low voltage level in response to the falling edge of the clock signal CK. In response to the falling edge of the clock signal at the time point t31, the inverter 621 is disabled by the clock signals CKB and CKI, and thus, the holding operation of the holding circuit 62 is disabled.

At the time t61, the next rising edge occurs on the clock signal CK. Each of the PMOS transistor 612 and the NMOS transistor 613 is switched to the turned-off state. The inverter 621 is enabled by the clock signals CKB and CKI. Thus, the holding circuit 62 performs the holding operation through the inventers 620 and 621 to hold the high voltage level of the enable signal ENL. Due to the high voltage level of the enable signal ENL, the clock gating signal ENCK generated by the AND logic gate 210 is switched to a high voltage level in response to the rising edge of the clock signal CK.

Then, another falling edge of the clock signal CK occurs at the time point t32. The PMOS transistors 610 and 612 and the NMOS transistor 613 and 614 are turned on, and the PMOS transistor 611 and NMOS transistor 615 are turned off. The enable signal S60 is maintained at the low voltage level according to the operation voltage VS S. The inverter 620 generates the enable signal ENL with the high voltage level. The inverter 621 is disabled by the clock signals CKB and CKI. Due to the high voltage level of the enable signal ENL, the clock gating signal ENCK generated by the AND logic gate 210 is switched to the low voltage level in response to the falling edge of the clock signal CK. In response to the falling edge of the clock signal at the time point t32, the inverter 621 is disabled by the clock signals CKB and CKI.

At the time t62, another rising edge occurs on the clock signal CK. Each of the PMOS transistor 612 and the NMOS transistor 613 is switched to the turned-off state. The inverter 621 is enabled by the clock signals CKB and CKI. Thus, the holding circuit 62 performs the holding operation through the inverters 620 and 621 to hold the high voltage level of the enable signal ENL. Due to the high voltage level of the enable signal ENL, the clock gating signal ENCK generated by the AND logic gate 210 is switched to the high voltage level in response to the rising edge of the clock signal CK.

After the time point t62, the clock enable signal CEN is switched to the low voltage level (that is, the clock enable signal CEN is de-asserted).

At the time point t33, another falling edge of the clock signal CK occurs. The PMOS transistors 610-612 and the NMOS transistor 613 are turned on, and NMOS transistors 614 and 615 are turned off. The enable signal S60 is switched to the high voltage level (that is, the enable signal S60 is de-asserted) according to the operation voltage VDD. The inverter 620 generates the enable signal ENL with the low voltage level. Due to the low voltage level of the enable signal ENL, the clock gating signal ENCK generated by the AND logic gate 210 is switched to the low voltage level based on the logic operation of the AND logic gate 210.

According to the above operation, the clock gating signal ENCK corresponds to the clock signal CK during the asserted period (high voltage level) of the enable signal ENL. Except these two pulse, the clock gating signal ENCK is maintained at the low voltage level, thereby achieving the clock gating operation of the clock gating cell.

When the clock enable signal CEN is asserted again or the testing enable signal is asserted, at least one pulse occurs on the clock gating signal ENCK in response to at least one falling edge of the clock signal CK during the asserted period of the enable signal ENL. For example, referring to FIG. 5, when the testing enable signal is asserted, two pulses occurs on the clock gating signal ENCK in response to two falling edges of the clock signal CK during the asserted period of the enable signal ENL. The operations of the inverting circuit 60, the sampling circuit 61, the holding circuit 62, and the AND gate circuit 21 are similar to those for the asserted clock enable signal CEN as described above. Thus, the related description is omitted here.

In the embodiment of FIG. 6A, the inverting circuit 60, the sampling circuit 61, the holding circuit 62 operate based on the voltage threshold VT1, while the AND gate circuit 21 operates based on the voltage threshold VT2. In details, the devices 601, 602, 610-615, 620, and 621 operate based on the voltage threshold VT1, while the AND logic gate 210 operates based on the voltage threshold VT2

Figure 6B:
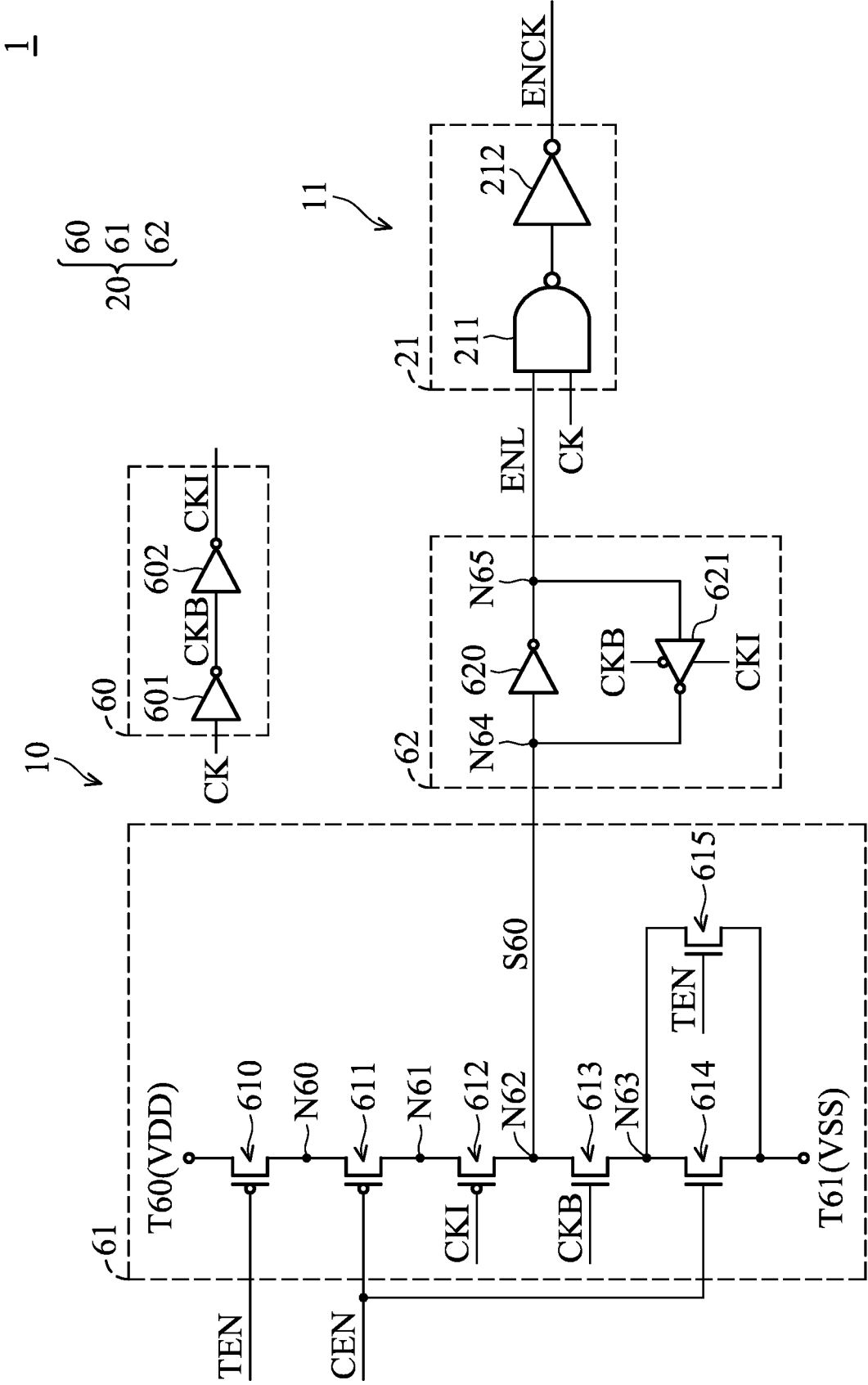
FIG. 6B shows another exemplary embodiment of a clock gating cell.

In another embodiment, the AND gate circuit 21 in the embodiment of FIG. 6A is implemented by a NAND logic gate 211 and an inverter 212, as shown in FIG. 6B. The connection and operations of the NAND logic gate 211 and the inverter 212 are the same as the embodiment of FIG. 2B. Thus, the related description is omitted here. In the embodiment of FIG. 6B, the NAND logic gate 211 and the inverter 212 operate based on the voltage threshold VT2.

Figure 7:
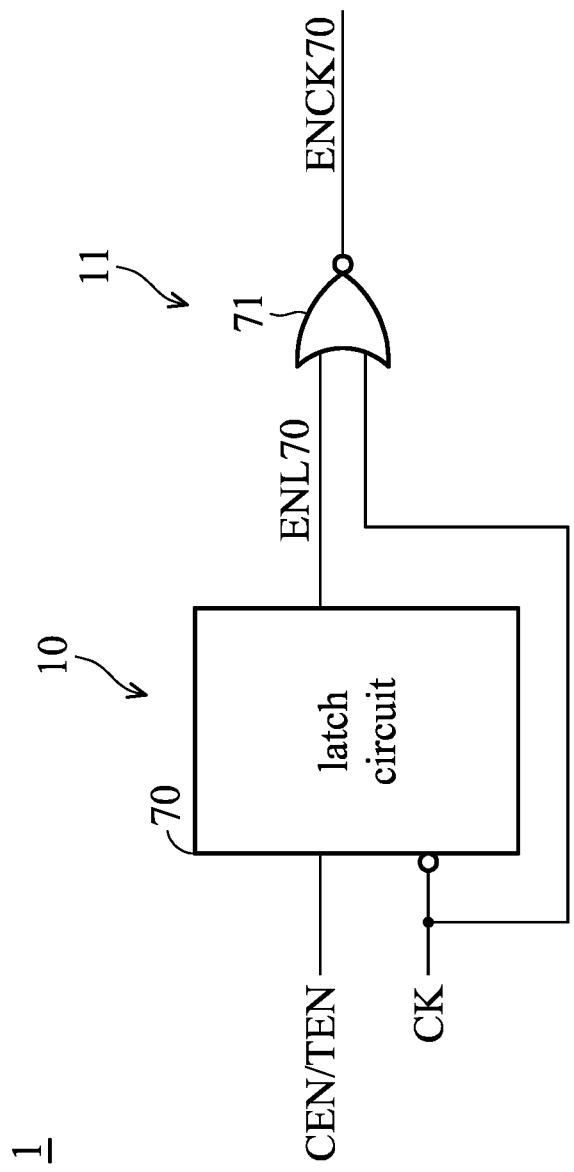
FIG. 7 shows another exemplary embodiment of a clock gating cell.

FIG. 7 shows another exemplary embodiment of the clock gating cell 1. Referring to FIG. 7, the input stage 10 comprises a latch circuit 70, and the output stage 11 comprises a NOR logic gate 71. The latch circuit 70 receives a clock enable signal CEN or a testing enable signal TEN and further receives a clock signal CK. The latch circuit 70 latches the received clock enable signal CEN or testing enable signal TEN in response to the falling edges of the clock signal CK to generate an enable signal ENL70. One input terminal of the NOR logic gate 71 receives the enable signal ENL70, and the other input terminal thereof receives the clock signal CK. The NOR logic gate 71 generates a clock gating signal ENCK70 at the output terminal of the NOR logic gate 71 according to the enable signal 70 and the clock signal CK. Through the operations of the latch circuit 70 and the NOR logic gate 71, the clock gating operation is achieved.

In the embodiment of FIG. 7, the latch circuit 70 in the input stage 10 operates based on the voltage threshold VT1, while the NOR gate circuit 71 in the output stage 11 operates based on the voltage threshold VT2. In one embodiment, the voltage threshold VT1 is greater than the voltage threshold VT2. In another embodiment, the voltage threshold VT2 is greater than the voltage threshold VT1. The magnitude relationship between the voltage threshold VT1 and VT2 is determined according to requirements or specifications of system or hardware designs.

According to the above embodiments, a clock gating cell operates based on multiple voltage thresholds. The clock gating cell is divided two portions: an input stage and an output stage. One of the two stages operates based on a high voltage threshold, while the other one of the two stages operates on a low voltage threshold. When a clock tree comprises clock gating cells, each of which has different voltage thresholds, the better performance of the clock tree can be achieved. Moreover, the leakage current of the clock tree is reduced, which causes less power consumption.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A clock gating cell comprising:
an input stage receiving a first clock signal and at least one input enable signal and generating a first enable signal corresponding to one of the least one input enable signal according to the first clock signal; and
an output stage, coupled to the input stage, receiving the first enable signal and the first clock signal and generating a clock gating signal according to the first enable signal and the first clock signal, wherein the output stage comprises:
a NAND logic gate having a first input terminal receiving the first clock signal, a second input terminal receiving the first enable signal, and an output terminal; and
an inverter having an input terminal coupled to the output terminal of the NAND logic gate and an output terminal outputting the clock gating signal;
wherein the input stage operates based on a first voltage threshold, and the NAND logic gate and the inverter operate based on a second voltage threshold, and
wherein the first voltage threshold is different from the second voltage threshold.

2. The clock gating cell as claimed in claim 1, wherein the first voltage threshold is greater than the second voltage threshold.

3. The clock gating cell as claimed in claim 1, wherein the second voltage threshold is greater than the first voltage threshold.

4. The clock gating cell as claimed in claim 1, wherein:
the at least one input enable signal comprises only one input enable signal;
the input stage comprises a latch circuit, and the latch circuit receives the one input enable signal and the first clock signal and latches the one input enable signal in response to rising or falling edges of the first clock signal to generate the first enable signal.

5. The clock gating cell as claimed in claim 4, wherein the latch circuit operates based on the first voltage threshold.

6. The clock gating cell as claimed in claim 1, wherein the at least one input enable signal comprises a testing enable signal and a clock enable signal, and the input stage comprises:
a selector receiving the testing enable signal and the clock enable signal and selecting one of the testing enable signal and the clock enable signal to serve as a second enable signal,
wherein the input stage generates the first enable signal corresponding to the second enable signal according to the first clock signal.

7. The clock gating cell as claimed in claim 6, wherein:
the input stage further comprises a latch circuit, and the latch circuit receives the second enable signal and the first clock signal and latches the second enable signal in response to rising or falling edges of the first clock signal to generate the first enable signal.

8. The clock gating cell as claimed in claim 7, wherein the selector and the latch circuit operate based on the first voltage threshold.

9. The clock gating cell as claimed in claim 1, wherein the at least one input enable signal comprises a testing enable signal and a clock enable signal, and the input stage comprises:
an inverting circuit receiving the first clock signal, generating a second clock signal inverse to the first clock signal, and further generating a third clock signal inverse to the second clock signal;
a sampling circuit receiving the testing enable and the clock enable signal and controlled by the second clock signal and the third clock signal to generate a second enable signal, wherein in response to one of the testing enable and the clock enable signal being asserted, the second enable signal is asserted; and
a holding circuit coupled to the sampling circuit to receive the second enable signal and generating the first enable signal according to the second enable signal, wherein the latch circuit is configured to hold a voltage level of the first enable signal.

10. The clock gating cell as claimed in claim 9, wherein the sampling circuit comprises:
a first P-type transistor coupled between a first voltage terminal and a first node and controlled by the testing enable signal;
a second P-type transistor coupled between the first node and a second node and controlled by the clock enable signal;
a third P-type transistor coupled between the second node and a third node and controlled by the third clock signal;
a first N-type transistor coupled between the third node and a fourth node and controlled by the second clock signal;
a second N-type transistor coupled between the fourth node and a second voltage terminal and controlled by the clock enable signal; and
a third N-type-transistor coupled between the fourth node and the second voltage terminal and controlled by the testing enable signal.

11. The clock gating cell as claimed in claim 9, wherein the latch circuit is coupled to the sampling circuit at an input node to receive the second enable signal and coupled to the output stage at an output node, and the holding circuit comprises:
a first inverter having an input terminal coupled to the input node and an output terminal coupled to the output node; and
a second inverter having an input terminal coupled to the output node and an output terminal coupled to the input node and controlled by the second clock signal and the third clock signal to be enabled or disabled,
wherein in response to the second inverter being enabled, the latch circuit is enabled, and
wherein the first enable signal is generated at the output node.

12. The clock gating cell as claimed in claim 9, wherein the output stage comprises:
an AND logic gate receiving the first clock signal and the first enable signal and generating the clock gating signal.

13. The clock gating cell as claimed in claim 9, wherein the output stage comprises:
a NAND logic gate having a first input terminal receiving the first clock signal, a second input terminal receiving the first enable signal, and an output terminal;
an inverter having an input terminal coupled to the output terminal of the NAND logic gate and an output terminal outputting the clock gating signal.

14. The clock gating cell as claimed in claim 9, wherein the inverting circuit, the sampling circuit, and the latch circuit operate based on the first voltage threshold.

15. The clock gating cell as claimed in claim 1, wherein:
the at least one input enable signal comprises only one input enable signal;
the input stage comprises a latch circuit, and the latch circuit receives the input enable signal and the first clock signal and latches the input enable signal in response to rising or falling edges of the first clock signal to generate the first enable signal,
the output stage comprises a NOR logic gate and the NOR logic gate receives the first enable signal and the first clock signal and generates the clock gating signal which corresponds to the first clock signal in an asserted period of the first enable signal.

16. The clock gating cell as claimed in claim 15, wherein the latch circuit operates based on the first voltage threshold, and the NOR gate circuit operates based on the second voltage threshold.

* * * * *